United States Patent
Hong et al.

(10) Patent No.: US 12,364,121 B2
(45) Date of Patent: Jul. 15, 2025

(54) DISPLAY SUBSTRATE, DISPLAY DEVICE, AND METHOD FOR DRIVING DISPLAY DEVICE

(71) Applicants: Hefei BOE Optoelectronics Technology Co., Ltd., Anhui (CN); BOE Technology Group Co., Ltd., Beijing (CN)

(72) Inventors: Jun Hong, Beijing (CN); Fei Xu, Beijing (CN); Yanbin Wang, Beijing (CN); Jingyong Li, Beijing (CN); Wenhong Tian, Beijing (CN)

(73) Assignees: Hefei BOE Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/908,413

(22) PCT Filed: Nov. 15, 2021

(86) PCT No.: PCT/CN2021/130563
§ 371 (c)(1),
(2) Date: Aug. 31, 2022

(87) PCT Pub. No.: WO2022/222446
PCT Pub. Date: Oct. 27, 2022

(65) Prior Publication Data
US 2024/0196672 A1    Jun. 13, 2024

(30) Foreign Application Priority Data
Apr. 20, 2021   (CN) .......................... 202110424911.7

(51) Int. Cl.
*H01L 29/08* (2006.01)
*G09G 3/3258* (2016.01)
(Continued)

(52) U.S. Cl.
CPC ......... *H10K 59/131* (2023.02); *G09G 3/3258* (2013.01); *H10K 59/879* (2023.02);
(Continued)

(58) Field of Classification Search
CPC .. H10K 59/131; H10K 59/879; G09G 3/3258; G09G 2300/0426; G09G 2320/028
(Continued)

(56) References Cited

U.S. PATENT DOCUMENTS

2011/0102413 A1   5/2011   Hamer et al.
2014/0361316 A1   12/2014  Nozawa et al.
(Continued)

FOREIGN PATENT DOCUMENTS

CN    104900684 A    9/2015
CN    106340532 A    1/2017
(Continued)

OTHER PUBLICATIONS

CN 202110424911.7 first office action.
PCT/CN2021/130563 international search report and written opinion.

*Primary Examiner* — Phuc T Dang
(74) *Attorney, Agent, or Firm* — IPro, PLLC (57) ABSTRACT

A display substrate, a display device, and a method for driving a display device are provided. The display substrate includes a substrate, a drive circuit layer formed on the substrate, a light-emitting unit on a side of the drive circuit layer away from the substrate, and a light-transmitting layer on a side of the light-emitting unit away from the substrate; the light-emitting unit comprises a first electrode layer, a light-emitting layer and a second electrode layer which are laminated in sequence, the second electrode layer comprises a plurality of second electrode patterns which are arranged independently and insulated from each other, and at least
(Continued)

part of the second electrode patterns are connected to different common voltage terminals. According to the embodiments of the present disclosure, the proportion of light of different colors in the light-emitting units located at different positions is controlled, which helps to improve the display effect.

15 Claims, 5 Drawing Sheets

(51) Int. Cl.
*H10K 59/131* (2023.01)
*H10K 59/80* (2023.01)

(52) U.S. Cl.
CPC .............. *G09G 2300/0426* (2013.01); *G09G 2320/028* (2013.01)

(58) Field of Classification Search
USPC .......................................... 257/40
See application file for complete search history.

(56) References Cited

U.S. PATENT DOCUMENTS

| | | |
|---|---|---|
| 2018/0130852 A1 | 5/2018 | Hsu |
| 2019/0172888 A1 | 6/2019 | Choi et al. |
| 2019/0206312 A1 | 7/2019 | Guo |
| 2021/0215964 A1 | 7/2021 | Long |

FOREIGN PATENT DOCUMENTS

| | | | | |
|---|---|---|---|---|
| CN | 107123402 A | | 9/2017 | |
| CN | 107967896 A | * | 4/2018 | ........... G09G 3/3233 |
| CN | 109087933 A | | 12/2018 | |
| CN | 208795983 U | | 4/2019 | |
| CN | 110109296 A | | 8/2019 | |
| CN | 111490081 A | * | 8/2020 | ........... H01L 27/3211 |
| CN | 113140608 A | | 7/2021 | |
| JP | 2014209480 A | * | 11/2014 | ......... H01L 27/3246 |

* cited by examiner

DISPLAY SUBSTRATE, DISPLAY DEVICE, AND METHOD FOR DRIVING DISPLAY DEVICE

CROSS-REFERENCE TO RELATED APPLICATION

The present application is the U.S. national phase of PCT Application No. PCT/CN2021/130563 filed on Nov. 15, 2021, and claims priority to Chinese Patent Application No. 202110424911.7 filed in China on Apr. 20, 2021, the entire contents of which are hereby incorporated by reference.

TECHNICAL FIELD

The present disclosure relates to the technical field of display, and more particularly, to a display substrate, a display device, and a method for driving a display device.

BACKGROUND

A micro-display device of a Micro-organic light emitting diode (Micro-OLED) usually uses a single crystal silicon wafer as a backplane, and a light-emitting unit is fabricated on the backplane. Since the micro-display device of the Micro-OLED has characteristics of self-emission, thin thickness, light weight, large viewing angle, short response time and high light-emitting efficiency, and is easier to realize high pixels per inch (PPI)), small size, easy carry, low power consumption, it is particularly suitable for Augmented Reality (AR)/Virtual Reality (VR) display devices such as a helmet-mounted display, a stereoscopic display mirror and an eyeglass-type displays.

SUMMARY

In a first aspect, a display substrate is provided by an embodiment of the present disclosure, including a substrate, a drive circuit layer formed on the substrate, a light-emitting unit on a side of the drive circuit layer away from the substrate, and a light-transmitting layer on a side of the light-emitting unit away from the substrate:

the light-emitting unit includes a first electrode layer, a light-emitting layer and a second electrode layer which are laminated in sequence, the second electrode layer includes a plurality of second electrode patterns which are arranged independently and insulated from each other, and at least part of the second electrode patterns are connected to different common voltage terminals.

In one embodiment, the display substrate includes a plurality of pixel units, each of the pixel units includes a plurality of sub-pixels of different colors, and the sub-pixels of different colors are corresponding to different second electrode patterns, respectively.

In one embodiment, second electrode patterns corresponding to sub-pixels of the same color are connected to the same common voltage terminal to obtain a common voltage signal.

In one embodiment, the display substrate includes a plurality of pixel units, and each of the pixel units includes a plurality of sub-pixels of different colors:

the display substrate includes a first display area and two second display areas respectively located at two opposite sides of the first display area: the second electrode patterns include a first sub-pattern corresponding to pixel units in the first display area, the second electrode patterns further include two second sub-patterns respectively corresponding to pixel units in the two second display areas, the two second sub-patterns are connected to the same common voltage terminal, and the first sub-pattern and the second sub-patterns are connected to different common voltage terminals.

In one embodiment, the display substrate further includes two third display areas, the two third display areas are respectively located at sides of the two second display areas away from the first display area, the second electrode pattern includes two third sub-patterns corresponding to pixel units in the two third display areas, the two third sub-patterns are respectively located at sides of the two second sub-patterns away from the first sub-pattern, and the two third sub-patterns are connected to the same common voltage terminal.

In one embodiment, each of the second electrode patterns extends from one end of the display substrate to the other opposite end along a first direction of the display substrate, each of the second electrode patterns is arranged along a second direction of the display substrate, the second direction is a direction from a front viewing angle to a side viewing angle, and the first direction is intersected with the second direction.

In one embodiment, each of the second electrode patterns is arranged in the same layer and made of the same material, and an insulating filling structure is filled between adjacent second electrode patterns.

In one embodiment, the first electrode layer includes a plurality of first electrode patterns which are arranged independently and insulated from each other, and the display substrate further includes a recess between two adjacent first electrode patterns, an orthographic projection of the recess onto the substrate covers at least part of an orthographic projection of the insulating filling structure onto the substrate.

In one embodiment, the light-transmitting layer includes a lens, an orthographic projection of the lens onto the substrate overlaps orthographic projections of the second electrode patterns onto the substrate, and the orthographic projection of the lens onto the substrate does not overlap the orthographic projection of the insulating filling structure on the substrate.

In a second aspect, a display device including the display substrate of any embodiment in the first aspect is provided by an embodiment of the present disclosure.

In a third aspect, a method for driving a display device, applicable to the display device in the second aspect, is provided by an embodiment of the present disclosure, the method includes the following steps:

detecting a viewing angle of a user relative to the display device: and controlling, in a case where the viewing angle is a side viewing angle, a common voltage corresponding to each of the second electrode patterns to be unequal.

In one embodiment, controlling the common voltage corresponding to each of the second electrode patterns to be unequal, includes:

controlling the common voltage corresponding to each of the second electrode patterns to be sequentially varied along a direction from a front viewing angle to a side viewing angle of the display device.

In one embodiment, after detecting the viewing angle of the user relative to the display device, the method further includes:

Controlling, in a case where the viewing angle is a front viewing angle, a common voltage corresponding to each of the second electrode patterns to be equal.

The display substrate provided by the embodiments of the present disclosure includes a the substrate, the drive circuit layer formed on the substrate, the light-emitting unit on the side of the drive circuit layer away from the substrate, and the light-transmitting layer on the side of the light-emitting unit away from the substrate: the light-emitting unit includes the first electrode layer, the light-emitting layer and the second electrode layer which are laminated in sequence, the second electrode layer includes the plurality of second electrode patterns which are arranged independently and insulated from each other, and at least part of the second electrode patterns are connected to different common voltage terminals. According to the embodiments of the present disclosure, the common voltages corresponding to different light-emitting units can be controlled according to needs by providing second electrode patterns which are arranged independently and insulated from each other, to control the proportion of light of different colors in the light-emitting units located at different positions, which helps to improve the display effect.

BRIEF DESCRIPTION OF THE DRAWINGS

In order to more clearly illustrate the technical solutions of the embodiments of the present disclosure, a brief description will be given below with reference to the accompanying drawings which are required to be used in the description of the embodiments of the present disclosure. It is obvious that the drawings in the following description are only some embodiments of the present disclosure, and a person skilled in the art can obtain other drawings according to these drawings without involving any inventive effort.

DETAILED DESCRIPTION

The embodiments of the present disclosure will now be described more fully hereinafter with reference to the accompanying drawings, in which some, but not all embodiments of the disclosure are shown. Based on the embodiments in the present disclosure, all other embodiments obtained by a person of ordinary skill in the art without inventive effort fall within the scope of the present disclosure.

A display substrate is provided by an embodiment of the present disclosure.

It should be understood that the technical solutions of the embodiments of the present disclosure are mainly applied to a near-eye display device such as AR/VR. An applicant of the present disclosure finds that a display device, particularly the near-eye display device, may appear obvious color uneven, or called color cast, during use.

Figure 1:
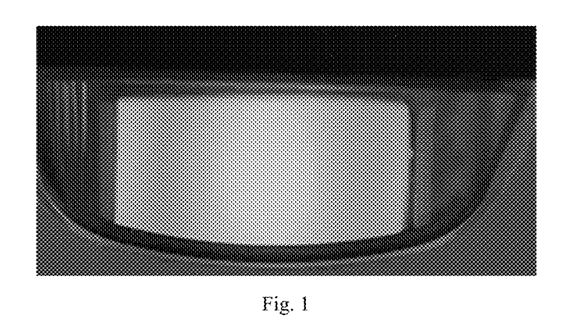
FIG. 1 is a schematic diagram of a display effect of a near-eye display device.

As shown in FIG. 1, a display effect in a center area of the display device is relatively normal, while display effects in two side areas are different from that of the center area, generally showing a reddish color.

The applicant finds that because the near-eye display device is relatively close to eyes of a user, different areas of the display device have a relatively large difference in angle, or called viewing angle, relative to the eyes of the user. In general, the larger the size of the display device, the better the user experience. However, the larger the size of the display device, the larger the difference in viewing angles corresponding to the center area and the edge areas, the more obvious the color cast.

Figure 2:
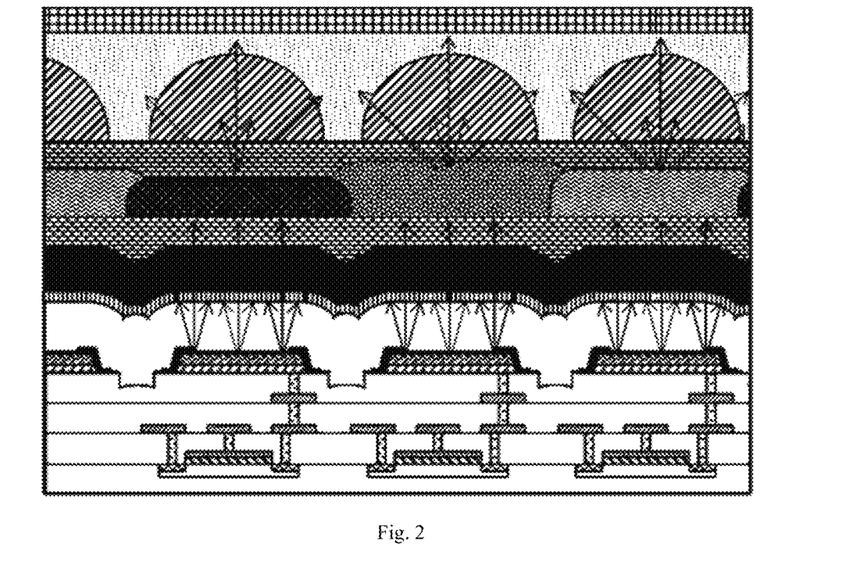
FIG. 2 is a schematic diagram of partial light emitting of the display device.

The applicant further finds that, as shown in FIG. 2, for the near-eye display device, a line of sight of the user is substantially perpendicular to the central area of the display device, which is also referred to as a front viewing angle area in this embodiment. In the front viewing angle area, a mixing effect of different colors of light meets a set requirement, and therefore, the display effect of the front viewing angle area is substantially normal.

Inclination degree of line of sight of the user' with respect to the areas of the two side edges of the display device is relatively large, and these areas are also referred to as side viewing angle areas in this embodiment.

Figure 3:
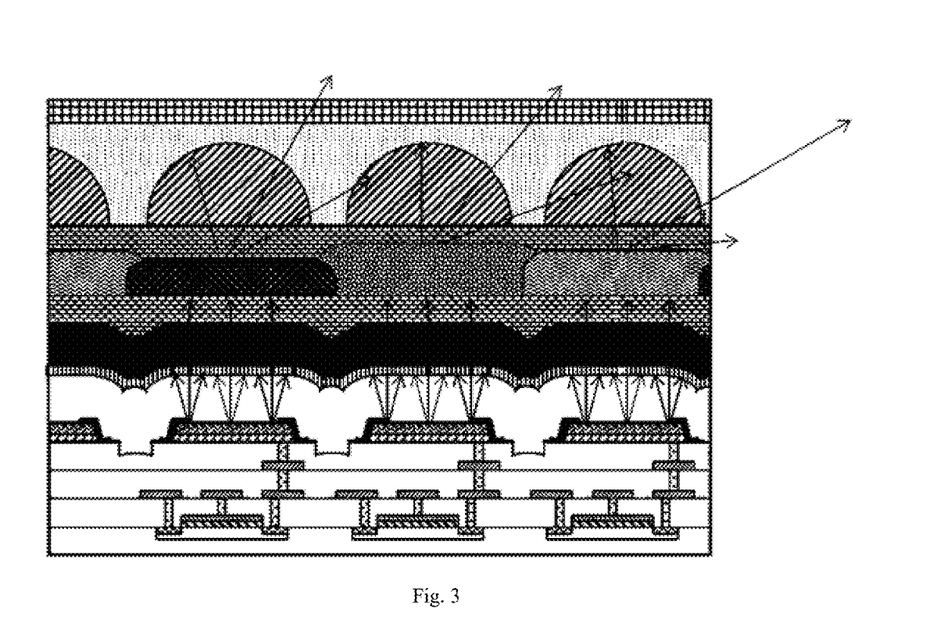
FIG. 3 is another schematic diagram of partial light emitting of the display device.

As shown in FIG. 3, since the light-transmitting layer generally includes an encapsulation structure, a color film, and a lens, when light passes through the light-transmitting layer, refractive indexes of different colors of light are different, and pixels at the edges may need to be specially designed to adapted to their specific positions, which lead to a change in a mixing ratio of different colors of the light when the light is transmitted to the eyes of the user, resulting in a color cast of an image actually observed by the user with respect to an image in a front viewing angle area.

Taking the display device shown in FIG. 1 as an example, the color cast of the display device is represented by the side viewing angle optical parameter $\Delta uv$ in this embodiment.

$$\Delta uv = \sqrt{(u_{0°} - u_{45°})^2 + (v_{0°} - v_{45°})^2}$$

In the above formula, u and v represent color coordinates, respectively, and their corner mark represents a viewing angle. After tests, in a case of front viewing angle, the color coordinates are standard values of (0.31, 0.33) in a CIExyY coordinate system. In a case of large viewing angle of 45°, the color coordinates have been far biased to 0.35-0.45, furthermore, there may be some asymmetry on left and right sides, thus leading to $\Delta uv$ exceeding the standard value, which is about 0.025 in this embodiment. Obviously, the above-mentioned values are only test results of the display device shown in FIG. 1 in a certain display state, and do not fully represent performance of the display device in all operating states.

Figure 4:
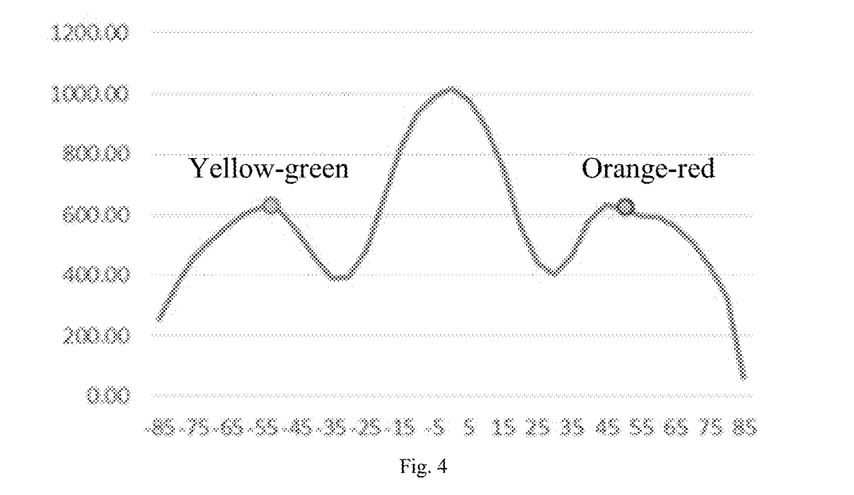
FIG. 4 is a test result of optical data of the display device shown in FIG. 1.

As shown in FIG. 4, FIG. 4 is a result of the color cast test on the display device shown in FIG. 1, where an abscissa represents the viewing angle in degrees, and an ordinate represents a brightness in nit. It can be seen from FIG. 4 that, within viewing angles of ±25°, brightnesses on both sides of the display device are substantially symmetrical with respect to a viewing angle of 0°, and outside the viewing angle of ±25°, there is a certain difference in brightness, where a left part is more represented as yellow-green, and a right part is more represented as orange-red.

Figure 5:
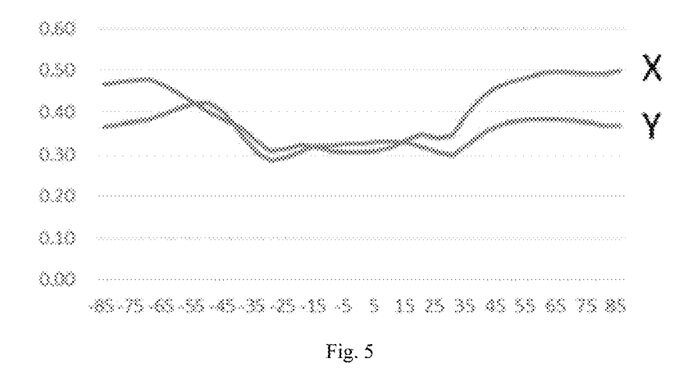
FIG. 5 is another test result of the optical data of the display device shown in FIG. 1.

As shown in FIG. 5, which is results of the color coordinates of the display device shown in FIG. 1, an abscissa represents the viewing angle in degrees, an ordinate represents the color coordinates in the CIExyY coordinate system, and X and Y represent values of the two color coordinates, respectively. It can be seen from FIG. 5 that the color coordinates on the left and right sides of the display device are not completely symmetrical, and there is a certain color cast.

Figure 6:
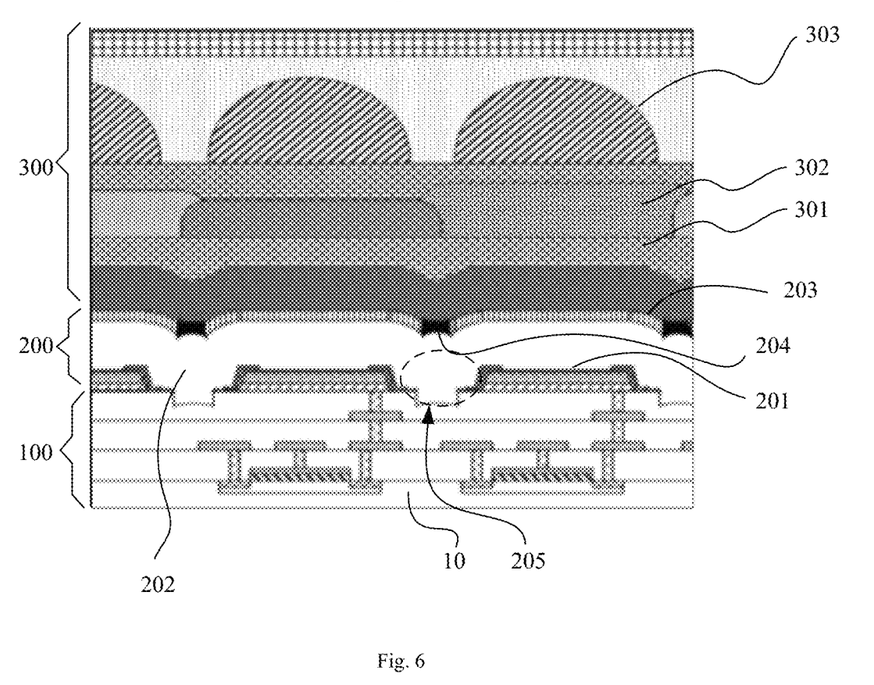
FIG. 6 is a schematic structural diagram of the display device in an embodiment of the present disclosure.

As shown in FIG. 6, in some embodiments, the display substrate includes a substrate 10, a drive circuit layer 100 formed on the substrate 10, a light-emitting unit 200 on a side of the drive circuit layer 100 away from the substrate 10, and a light-transmitting layer 300 on a side of the light-emitting unit 200 away from the substrate 10, where the light-emitting layer 300 mainly includes an encapsulation structure 301, a color film 302, and a lens 303.

In this embodiment, the substrate 10 may be a single crystal silicon wafer, and the drive circuit layer 100 is directly fabricated on the substrate 10, thereby forming a backplane including the drive circuit layer 100.

In this embodiment, the light-emitting unit 200 includes a first electrode layer 201, a light-emitting layer 202, and a second electrode layer 203 which are laminated in sequence, where the first electrode layer 201 may be an anode of the light-emitting unit 200 for providing a driving voltage for light emission of the light-emitting unit 200, and the second electrode layer 203 may be a cathode of the light-emitting unit 200 for providing a common voltage for the light-emitting unit 200.

The second electrode layer 203 includes a plurality of second electrode patterns which are arranged independently and insulated from each other, and at least part of the second electrode patterns are connected to different common voltage terminals. By providing second electrode patterns which are arranged independently and insulated from each other, different common voltage terminals can be used to provide the same or different common voltages for the second electrode patterns according to needs, to adjust a light-emitting effect of the light-emitting unit 200. In this way, by adjusting the common voltage, a difference in proportion of light of different colors in each area can be reduced, thereby reducing a phenomenon of color cast.

According to the embodiments of the present disclosure, the common voltages corresponding to different light-emitting units 200 can be controlled according to needs by providing second electrode patterns which are arranged independently and insulated from each other, to control the proportion of light of different colors in light-emitting units 200 located at different positions, which helps to improve the display effect.

Figure 7:
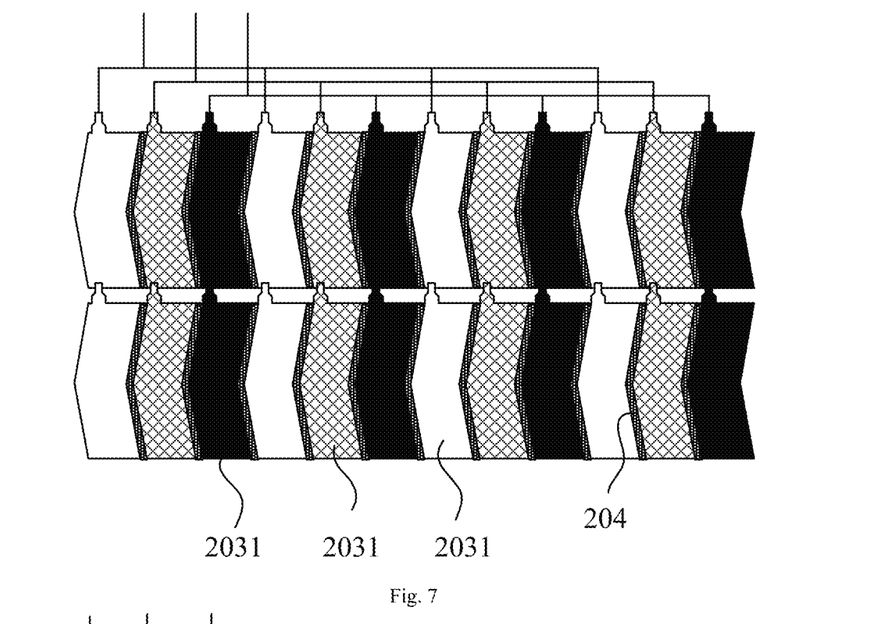
FIG. 7 is a schematic structural diagram of a second electrode layer in an embodiment of the present disclosure.

As shown in FIG. 7, in some embodiments, the display substrate includes a plurality of pixel units, each of the pixel units includes a plurality of sub-pixels of different colors, and the sub-pixels of different colors are corresponding to different second electrode patterns, respectively. Different filling effects in FIG. 7 represent second electrode patterns 2031 corresponding to the sub-pixels of different colors.

Taking each of the pixel units in the display substrate including three sub-pixels of different colors of red, green and blue as an example, in implementation, red sub-pixels, green sub-pixels and blue sub-pixels of different pixel units are respectively set corresponding to different second electrode patterns 2031, so that the sub-pixels of different colors can be controlled to have different common voltages, thereby implementing uniform control of luminous intensities of the sub-pixels of different colors, and further implementing adjustment of the proportion of light for different areas.

In some embodiments, second electrode patterns 2031 corresponding to sub-pixels of the same color are connected to the same common voltage terminal to obtain a common voltage signal.

In the technical solution of the present embodiment, the second electrode patterns 2031 corresponding to the same color in different areas provide the common voltage signal via the same common voltage terminal. It can be understood that the common voltages of sub-pixels of the same color in various areas in the display substrate are all equal, which helps to simplify the common voltage control process.

It should be understood that in the central area of the display device, i.e. a front viewing angle area, the proportion of light of different colors generally meets the requirements and that by adjusting the common voltage, the proportion of light of different colors in the side viewing angle region is brought closer to a desired value to reduce the color cast in the different areas.

It should be noted that since the common voltages of the sub-pixels of the same color are all equal, the adjustment of the common voltage in a side viewing angle region changes the proportion of the different colors in the front viewing angle region, and this change may lead to a decrease in the display effect. In implementation, the display effect in the side viewing angle region can be improved by adjusting a value of the common voltage so as to reduce the display effect in the front viewing angle area to an acceptable level, thereby reducing the overall color cast of the display device.

Figure 8:
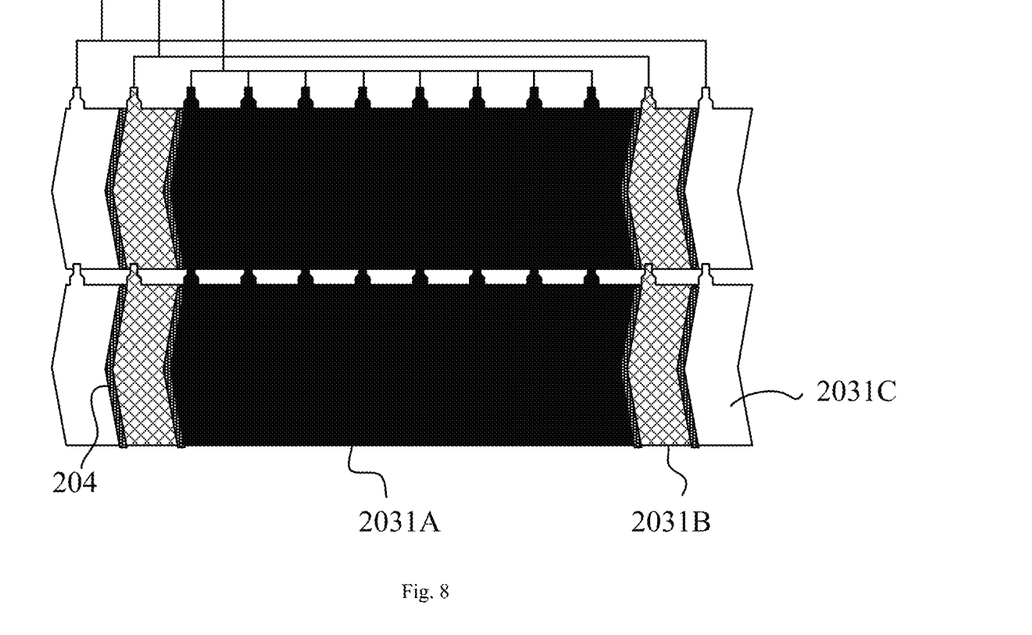
FIG. 8 is a schematic structural diagram of another second electrode layer in an embodiment of the present disclosure.
Figure 9:
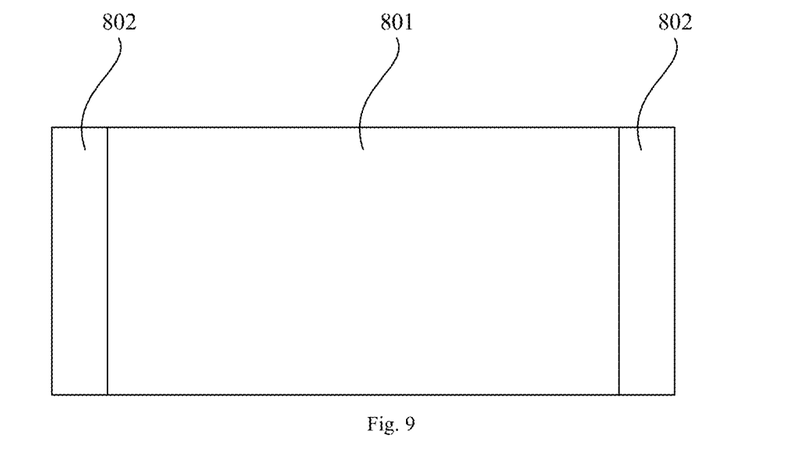
FIG. 9 is a schematic diagram of a display area division in an embodiment of the present disclosure.

As shown in FIG. 9, in some embodiments, the display substrate includes a first display area 801 and two second display areas 802 respectively located at two opposite sides of the first display area 801. Referring to FIGS. 8 and 9, the second electrode patterns include a first sub-pattern 2031A corresponding to pixel units in the first display area 801, the second electrode patterns further include two second sub-patterns 2031B respectively corresponding to pixel units in the two second display areas 802, the two second sub-patterns 2031B are connected to the same common voltage terminal, and the first sub-pattern 2031A and the second sub-pattern 2031B are connected to different common voltage terminals. Different filling effects in FIG. 8 correspond to the second electrode patterns 2031 of different display areas.

In the technical solution of the present embodiment, the first display area 801 corresponds to the above-mentioned front viewing angle region, the two second display areas 802 are respectively located at two opposite sides of the first display area 801, and the two second display areas 802 respectively correspond to two side viewing angle display areas located at two sides of the front viewing angle display area.

The two second sub-patterns 2031B may be arranged symmetrically with respect to the first sub-pattern 2031A, so that display effects of side viewing angle display areas located on both sides of the display device can be adjusted more uniformly.

It can be known from the above that the display effect of the front viewing angle region satisfies the display requirements, and therefore, the common voltage can be provided for the first display area 801 with reference to an existing display control mode to satisfy the display requirements.

For the second display areas 802, the common voltage may be controlled to have a different common voltage than the first display area 801 so as to adjust the proportion of light of different colors in the second display areas 802 to make their display effects closer to the desired value.

In some embodiments, the sub-pixels of different colors located in the second display areas 802 may correspond to the same second sub-pattern 2031B and the common voltages of the sub-pixels of different colors located in the second display areas 802 can be controlled uniformly.

In another implementation, the sub-pixels of different colors located in the second display areas 802 may correspond to different second sub-patterns 2031B, and the sub-pixels of different colors may be individually controlled to help improve the accuracy of the adjustment of the display effect to further improve the display effect.

Figure 10:
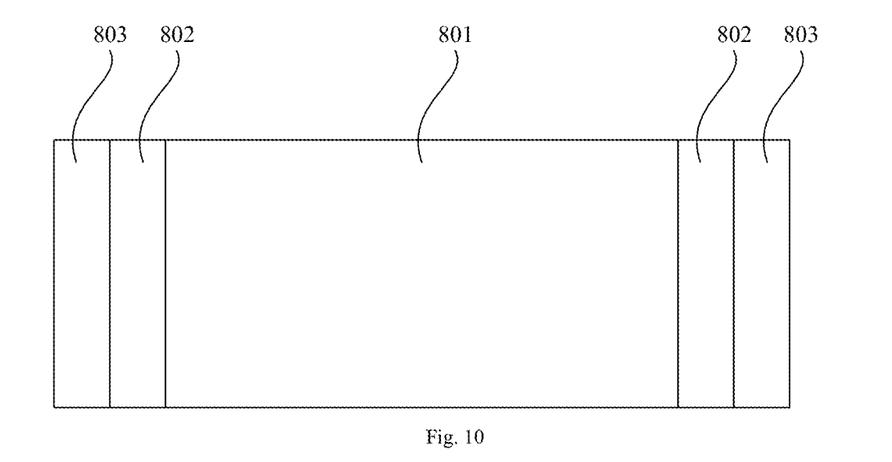
FIG. 10 is a schematic diagram of the display area division in another embodiment of the present disclosure.

As shown in FIG. 10, in some embodiments, the display substrate further includes two third display areas 803, the two third display areas 803 are respectively located at sides of the two second display areas 802 away from the first display area 801. Referring to FIGS. 8 and 10, the second electrode patterns include two third sub-patterns 2031C corresponding to pixel units in the two third display areas 803, the two third sub-patterns 2031C are respectively located at sides of the two second sub-patterns 2031B away from the first sub-pattern 2031A, and the two third sub-patterns 2031C are connected to the same common voltage terminal.

Since there may be a certain difference between the common voltage corresponding to the first display area 801 and the common voltage corresponding to the second display areas 802. If the difference is too large, there may be a sudden change in the display effects between the first display area 801 and the second display areas 802, and the sudden change in the display effects may be more apparent between the first display area 801 and the second display areas 802. If the difference is too small, it may be difficult to adjust the display effect for the second display areas 802 to the desired value.

In this embodiment, a third display area 803 is further provided, and by providing the third display area 803, the common voltages corresponding to the first display area 801 to the third display area 803 can be gradually and sequentially changed, so that a difference between the common voltages of the central area and the edge areas of the display device can be increased, and a difference between common voltages of adjacent display areas can be relatively reduced, so that sudden changes in the display effect can be avoided.

Further, more display areas may be provided to help further improve smoothness of the change of the common voltages from the central area of the display device to the edge areas of the display device to help improve the display effect.

In some embodiments, each of the second electrode patterns extends from one end of the display substrate to the other opposite end along a first direction of the display substrate, each of the second electrode patterns is arranged along a second direction of the display substrate, the second direction is a direction from a front viewing angle to a side viewing angle, and the first direction intersects with the second direction.

In this embodiment, the first direction of the display substrate is arranged along a longitudinal direction of the display device, and the second direction of the display substrate is arranged along a horizontal direction of the display device. Here, the horizontal direction of the display device refers to a horizontal direction when the display device is normally used in a normal upright posture of a user, and the second direction may also be understood as a horizontal movement direction of the eyes of the user. By controlling the arrangement of the second electrode patterns and the extension directions, it is possible to provide substantially equal common voltages for display areas of the same viewing angle, contributing to balancing and enhancing the display effect.

Illustratively, in the case of the display device shown in FIG. 1, and the first direction is a longitudinal direction in FIG. 1, the second direction is a horizontal direction in FIG. 1. The display device has an elongated shape along the first direction. Therefore, the first direction is specifically a width direction of the display device shown in FIG. 1, and the second direction is a length direction of the display device shown in FIG. 1. Obviously, when a shape and a structure of the display device are changed, the first direction and the second direction thereof are correspondingly changed.

In some embodiments, each of the second electrode patterns is arranged in the same layer and made of the same material, and an insulating filling structure 204 is filled between adjacent second electrode patterns.

The different second electrode patterns are obtained by a one-time patterning process, and furthermore, a groove between adjacent second electrode patterns are filled by using an insulating material to provide the insulating filling structure 204, so that flatness of a subsequently manufactured film layer can be improved and an insulating effect between the second electrode patterns can be ensured.

In some embodiments, the first electrode layer 201 includes a plurality of first electrode patterns which are arranged independently and insulated from each other, and the display substrate further includes a recess 205 between two adjacent first electrode patterns, an orthographic projection of the recess 205 onto the substrate 10 covers at least part of an orthographic projection of the insulating filling structure 204 onto the substrate 10.

In this embodiment, the recess 205 is included between adjacent first electrode patterns, and the recess 205 is formed by a gap between the adjacent first electrode patterns. By controlling the position of the orthographic projection of the second electrode pattern onto the substrate 10 to correspond to the position of the recess 205, it is possible to improve the overall flatness of the second electrode pattern, help to improve the uniformity of thickness between the first electrode pattern and the corresponding second electrode pattern, and help to improve the display effect.

In some embodiments, the light-transmitting layer 300 includes a lens 303, an orthographic projection of the lens 303 onto the substrate 10 overlaps orthographic projections of the second electrode patterns onto the substrate 10, and the orthographic projection of the lens 303 onto the substrate 10 does not overlap the orthographic projection of the insulating filling structure 204 onto the substrate 10.

In this embodiment, the structures included in the light-transmitting layer 300 are used for adjusting the transmission direction of the light emitted by the light-emitting unit 200, where the lens 303 is one of the important structures for adjusting a transmission direction of the light. In order to avoid affecting the normal transmission of the light emitted by the light-emitting unit 200, in this embodiment, the position of the orthographic projection of the lens 303 onto the substrate 10 is controlled not to overlap with the insulating filling structure 204, and the normal display effect can also be avoided while ensuring the insulation between different second electrode patterns.

An embodiment of the present disclosure further provides a display device including the display substrate as any of the above embodiments.

Since the display device of the embodiments of the present disclosure includes all the technical solutions of the above-mentioned display substrate embodiments, at least all the above-mentioned technical effects can be achieved, which are not be repeated here.

An embodiment of the present disclosure further provides a method for driving a display device.

The method for driving a display device is applied to the above display device, and the display device may be a near-eye display device.

In an embodiment, the method includes the following steps:

a viewing angle of a user relative to the display device is detected; and in a case where the viewing angle is a side viewing angle, a common voltage corresponding to each of the second electrode patterns is controlled to be unequal.

It should be understood that, in general, a viewing angle of the user needs to be maintained as a front viewing angle, and in some special cases, the viewing angle of the user may be a side viewing angle, for example, where important information is displayed at an edge of the display device, or where the user adjusts a wearing posture of the display device. In the second case, the user may be prompted to adjust the wearing posture, while in the first case, the display effect needs to be adjusted to reduce or decrease the color cast.

In the technical solution of the present embodiment, the viewing angle of the user with respect to the display device refers to an angle between the line of sight of the user and the display device, and the viewing angle can be used to determine the viewing angle of the user with respect to the display device by detecting the position of the eyes of the user in a line of sight of an eye tracking device.

In this embodiment, a the viewing angle of a line of sight being perpendicular to the display device is defined as 0 degrees, a viewing angle range corresponding to the front viewing angle is smaller than a viewing angle range corresponding to the side viewing angle.

Illustratively, in an embodiment, the front viewing angle may be defined as a viewing angle range of −35 degrees to 35 degrees, and a viewing angle range corresponding to the side viewing angle may be defined as less than −35 degrees or greater than 35 degrees. Obviously, definitions of the viewing angle ranges of the front viewing angle and the side viewing angle are not limited thereto. It should be understood that the areas in which the color cast appear on different display devices may differ, and in practice, the front viewing angle and the side viewing angle may be set according to actual display effects of the different display devices.

In the case where the viewing angle is the side viewing angle, the common voltage corresponding to each of the second electrode patterns is controlled to be unequal, thereby reducing the color cast between different display areas.

Specifically, the step that the common voltage corresponding to each of the second electrode patterns is controlled to be unequal includes:

a common voltage corresponding to each of the second electrode patterns is controlled to be sequentially varied along a direction from the front viewing angle to the side viewing angle of the display device.

It should be understood that, in the technical solution of the present embodiment, in the case where the viewing angle is the side viewing angle, the common voltage corresponding to each of the second electrode patterns is controlled to be unequal, and in the direction from the front viewing angle to the side viewing angle of the display device, the common voltage provided may increase in sequence or decrease in sequence, and the actual change effect of the common voltage may be set according to the change of the display effect. In general, for an AR device, a VR device or other wearable device, when in a normal wearing state, the display area is generally arranged directly to the eyes of the user, and in this case, the front viewing angle region generally refers to the central area of the display area, and the side viewing angle areas refer to the areas located on both sides of the central region in a wearing state.

By controlling the common voltage of each of the second electrode patterns to be sequentially changed, it is possible to improve the smoothness of transition of the display effect between the adjacent display areas and to reduce a possible sudden change of the display effect.

In some embodiments, after the viewing angle of the user relative to the display device detected, the method further includes:

in a case where the viewing angle is a front viewing angle, a common voltage corresponding to each of the second electrode patterns is controlled to be equal.

If the viewing angle of the user is a front viewing angle, it means that the user is watching the central area of the display device, and in general, a display effect of the central area of the display device is relatively good. Therefore, when the user watches the central area of the display device, an influence caused by the color cast phenomenon is relatively small, and the common voltage corresponding to each of the second electrode patterns can be controlled to be equal, to simplify the control process.

The above are only specific embodiments of the present disclosure, but the protection scope of the present disclosure is not limited to this. Any skilled in the art who is familiar with the technical scope of the present disclosure can easily think of changes or equivalent. Therefore, the protection scope of the present disclosure should be subject to the protection scope of the claims.

What is claimed is:

1. A display substrate, comprising a substrate, a drive circuit layer formed on the substrate, a light-emitting unit on a side of the drive circuit layer away from the substrate, and a light-transmitting layer on a side of the light-emitting unit away from the substrate;

the light-emitting unit comprises a first electrode layer, a light-emitting layer and a second electrode layer which are laminated in sequence, the second electrode layer comprises a plurality of second electrode patterns which are arranged independently and insulated from each other, and at least part of the second electrode patterns are connected to different common voltage terminals, wherein each of the second electrode patterns is arranged in the same layer and made of the same material, and an insulating filling structure is filled between adjacent second electrode patterns.

2. The display substrate according to claim 1, wherein the display substrate comprises a plurality of pixel units, each of the pixel units comprises a plurality of sub-pixels of different colors, at least part of the sub-pixels of different colors are corresponding to different second electrode patterns, respectively.

3. The display substrate according to claim 2, wherein second electrode patterns corresponding to at least part of sub-pixels of the same color are connected to the same common voltage terminal to obtain a common voltage signal.

4. The display substrate according to claim 2, wherein each of the second electrode patterns extends from one end of the display substrate to the other opposite end along a first direction of the display substrate, each of the second electrode patterns is arranged along a second direction of the display substrate, the second direction is a direction from a front viewing angle to a side viewing angle, and the first direction is intersected with the second direction.

5. The display substrate according to claim 1, wherein the first electrode layer comprises a plurality of first electrode patterns which are arranged independently and insulated from each other, and the display substrate further comprises a recess between two adjacent first electrode patterns, an orthographic projection of the recess onto the substrate covers at least part of an orthographic projection of the insulating filling structure onto the substrate.

6. The display substrate according to claim 3, wherein each of the second electrode patterns extends from one end of the display substrate to the other opposite end along a first direction of the display substrate, each of the second electrode patterns is arranged along a second direction of the display substrate, the second direction is a direction from a front viewing angle to a side viewing angle, and the first direction is intersected with the second direction.

7. The display substrate according to claim 1, wherein the display substrate comprises a plurality of pixel units, and each of the pixel units comprises a plurality of sub-pixels of different colors;
the display substrate comprises a first display area and two second display areas respectively located at two opposite sides of the first display area; the second electrode patterns comprise a first sub-pattern corresponding to pixel units in the first display area, the second electrode patterns further comprise two second sub-patterns respectively corresponding to pixel units in the two second display areas, the two second sub-patterns are connected to the same common voltage terminal, and the first sub-pattern and the second sub-patterns are connected to different common voltage terminals.

8. The display substrate according to claim 7, wherein the display substrate further comprises two third display areas, the two third display areas are respectively located at sides of the two second display areas away from the first display area, the second electrode pattern comprises two third sub-patterns corresponding to pixel units in the two third display areas, the two third sub-patterns are respectively located at sides of the two second sub-patterns away from the first sub-pattern, and the two third sub-patterns are connected to the same common voltage terminal.

9. The display substrate according to claim 7, wherein each of the second electrode patterns extends from one end of the display substrate to the other opposite end along a first direction of the display substrate, each of the second electrode patterns is arranged along a second direction of the display substrate, the second direction is a direction from a front viewing angle to a side viewing angle, and the first direction is intersected with the second direction.

10. The display substrate according to claim 8, wherein each of the second electrode patterns extends from one end of the display substrate to the other opposite end along a first direction of the display substrate, each of the second electrode patterns is arranged along a second direction of the display substrate, the second direction is a direction from a front viewing angle to a side viewing angle, and the first direction is intersected with the second direction.

11. The display substrate according to claim 1, wherein the light-transmitting layer comprises a lens, an orthographic projection of the lens onto the substrate overlaps orthographic projections of the second electrode patterns onto the substrate, and the orthographic projection of the lens onto the substrate does not overlap the orthographic projection of the insulating filling structure on the substrate.

12. A display device, comprising the display substrate according to claim 1.

13. A method for driving a display device, applicable to the display device of claim 12, comprising following steps:
detecting a viewing angle of a user relative to the display device; and
controlling, in a case where the viewing angle is a side viewing angle, a common voltage corresponding to each of second electrode patterns to be unequal.

14. The method according to claim 13, wherein controlling the common voltage corresponding to each of the second electrode patterns to be unequal, comprises:
controlling the common voltage corresponding to each of the second electrode patterns to be sequentially varied substantially along a direction from a front viewing angle to a side viewing angle of the display device.

15. The method according to claim 13, wherein after detecting the viewing angle of the user relative to the display device, the method further comprises:
controlling, in a case where the viewing angle is a front viewing angle, a common voltage corresponding to each of the second electrode patterns to be equal.

* * * * *